(12) United States Patent
Suzuki et al.

(10) Patent No.: US 12,345,874 B2
(45) Date of Patent: Jul. 1, 2025

(54) MIRROR UNIT

(71) Applicant: HAMAMATSU PHOTONICS K.K., Hamamatsu (JP)

(72) Inventors: Daiki Suzuki, Hamamatsu (JP); Tomoyuki Ide, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 536 days.

(21) Appl. No.: 17/777,310

(22) PCT Filed: Sep. 16, 2020

(86) PCT No.: PCT/JP2020/035051
§ 371 (c)(1),
(2) Date: May 17, 2022

(87) PCT Pub. No.: WO2021/100300
PCT Pub. Date: May 27, 2021

(65) Prior Publication Data
US 2022/0404609 A1 Dec. 22, 2022

(30) Foreign Application Priority Data
Nov. 21, 2019 (JP) ................................. 2019-210634

(51) Int. Cl.
*G02B 26/08* (2006.01)
*G02B 7/182* (2021.01)
*G02B 26/10* (2006.01)

(52) U.S. Cl.
CPC ......... *G02B 26/085* (2013.01); *G02B 7/1821* (2013.01); *G02B 26/105* (2013.01)

(58) Field of Classification Search
CPC .. G02B 26/085; G02B 7/1821; G02B 26/105; G02B 7/008; B81B 2201/042; B81B 7/0067; B81B 7/007
See application file for complete search history.

(56) References Cited

U.S. PATENT DOCUMENTS 8,947,755 B2 * 2/2015 Konuma .............. G02B 26/105
359/212.2
9,348,134 B2 * 5/2016 Ichii ................... G02B 26/0833
(Continued)

FOREIGN PATENT DOCUMENTS

CN 101327848 A 12/2008
CN 104423036 A 3/2015
(Continued)

OTHER PUBLICATIONS

International Preliminary Report on Patentability mailed Jun. 2, 2022 for PCT/JP2020/035051.
(Continued)

*Primary Examiner* — Euncha P Cherry
(74) *Attorney, Agent, or Firm* — Faegre Drinker Biddle & Reath LLP

(57) ABSTRACT

A mirror unit includes a light scanning device and a package. The package has a main body portion provided with a light incident opening that opens on one side in a predetermined direction, a protrusion provided on a top surface of the main body portion, and a flat plate-shaped window member disposed on the top surface on an inward side of the protrusion and covering the light incident opening. An end surface of the protrusion on the one side is positioned more to the one side than the window member. A thickness of the protrusion is smaller than a height of the protrusion from the top surface. When viewed in any direction perpendicular to the predetermined direction, a length of a part covered by the protrusion in the window member is longer than a length of a part exposed from the protrusion in the window member.

9 Claims, 13 Drawing Sheets

(56) References Cited

U.S. PATENT DOCUMENTS

| | | | |
|---|---|---|---|
| 2005/0129353 A1 | 6/2005 | Torashima et al. | |
| 2008/0237768 A1 | 10/2008 | Yajima et al. | |
| 2009/0073526 A1* | 3/2009 | Uchikawa | G02B 26/105 |
| | | | 359/202.1 |
| 2015/0055204 A1 | 2/2015 | Ichii | |
| 2016/0116701 A1 | 4/2016 | Yamada et al. | |
| 2018/0068912 A1 | 3/2018 | Hsin et al. | |
| 2019/0391394 A1* | 12/2019 | Shinkawa | G02B 26/0858 |

FOREIGN PATENT DOCUMENTS

| | | |
|---|---|---|
| CN | 104516101 A | 4/2015 |
| CN | 105319808 A | 2/2016 |
| CN | 106896495 A | 6/2017 |
| CN | 107882599 A | 4/2018 |
| CN | 207851340 U | 9/2018 |
| CN | 109098780 A | 12/2018 |
| CN | 109407303 A | 3/2019 |
| EP | 1801888 A1 | 6/2007 |
| EP | 3276393 A1 | 1/2018 |
| JP | H8-184775 A | 7/1996 |
| JP | 2001-056442 A | 2/2001 |
| JP | 2007-080859 A | 3/2007 |
| JP | 2009-093105 A | 4/2009 |
| JP | 2011-059282 A | 3/2011 |
| JP | 2014-095796 A | 5/2014 |
| JP | 2015-041039 A | 3/2015 |
| JP | 2015-102785 A | 6/2015 |
| JP | 2015-195330 A | 11/2015 |
| JP | 2016-099567 A | 5/2016 |
| JP | 2017-026730 A | 2/2017 |
| JP | 2017-075989 A | 4/2017 |
| JP | 2017-191266 A | 10/2017 |
| JP | 2018-017832 A | 2/2018 |
| JP | 2019-074712 A | 5/2019 |
| WO | WO-2011/013581 A1 | 2/2011 |
| WO | WO-2019/009392 A1 | 1/2019 |

OTHER PUBLICATIONS

International Preliminary Report on Patentability mailed Jun. 2, 2022 for PCT/JP2020/035054.

Office Action dated Jan. 27, 2025 that issued in U.S. Appl. No. 17/777,306.

* cited by examiner

MIRROR UNIT

TECHNICAL FIELD

An aspect of the present disclosure relates to a minor unit.

BACKGROUND ART

Mirror units including a light scanning device that has a movable minor portion and a package that accommodates the light scanning device are known (for example, refer to Patent Literature 1 and Patent Literature 2). In such minor units, a light incident opening allowing light incident on the movable minor portion to pass through is provided in the package, and a window member is disposed such that the light incident opening is covered. Light is incident on the movable mirror portion from the outside via the window member, is reflected by the movable minor portion, and is emitted to the outside via the window member.

CITATION LIST

Patent Literature

[Patent Literature 1] Japanese Unexamined Patent Publication No. 2016-99567
[Patent Literature 2] Japanese Unexamined Patent Publication No. 2018-17832

SUMMARY OF INVENTION

Technical Problem

In the minor unit described in Patent Literature 1, the window member is placed on the package. In this case, there is concern that an external force may act on the window member and the window member may be damaged. Meanwhile, in the mirror unit described in Patent Literature 2, a protrusion is provided on a top surface of the package such that the light incident opening is surrounded, and the window member is fitted inside the protrusion. In this case, having a situation where an external force acts on the window member can be curbed, and the window member can be protected.

However, if the window member is simply fitted inside the protrusion, when the package thermally contracts or thermally expands (which may hereinafter be collectively stated as being thermally deformed) due to change of an environmental temperature or the like, for example, there is concern that the window member may warp by being pressed by the package. If warpage occurs in the window member, a refractive angle of light in the window member changes. Therefore, it is difficult to accurately perform light scanning.

Particularly, in a configuration in which light scanning is performed by swinging a movable minor portion as in the mirror units described above, an incident angle of light with respect to the window member increases depending on the angle of the movable minor portion, and a refractive angle of light emitted from the window member increases. For this reason, in order to realize highly accurate light scanning, there is a need to consider an influence of refraction at the window member. Hence, it is conceivable that an influence of refraction at the window member be curbed by forming the window member to be thin to reduce the amount of refraction at the window member. However, if the window member is formed to be thin, the window member is likely to warp when the package is thermally deformed. Particularly, when the incident angle of light with respect to the window member increases, an influence of warp deformation of the window member on accuracy of light scanning increases.

An aspect of the present disclosure has been made in consideration of the foregoing circumstances, and an object thereof is to provide a minor unit in which highly accurate light scanning can be realized while a window member is reliably protected.

Solution to Problem

A mirror unit according to an aspect of the present disclosure includes a light scanning device including a movable minor portion, and a package accommodating the light scanning device. The package includes a main body portion provided with an light incident opening that opens on one side in a predetermined direction and holding the light scanning device such that light incident from the light incident opening is able to be incident on the movable mirror portion, a protrusion provided on a top surface of the main body portion so as to extend along an edge of the light incident opening, and a flat plate-shaped window member disposed on the top surface on an inward side of the protrusion and covering the light incident opening. An end surface of the protrusion on the one side is positioned more to the one side than the window member. A thickness of the protrusion is smaller than a height of the protrusion from the top surface. When viewed in any direction perpendicular to the predetermined direction, a length of a part covered by the protrusion in the window member is longer than a length of a part exposed from the protrusion in the window member.

In this minor unit, the protrusion is provided on the top surface of the main body portion so as to extend along the edge of the light incident opening, and the window member is disposed on the top surface on the inward side of the protrusion. Further, the end surface of the protrusion on the one side is positioned more to the one side than the window member. In addition, when viewed in any direction perpendicular to the predetermined direction, the length of a part covered by the protrusion in the window member is longer than the length of a part exposed from the protrusion in the window member. Accordingly, having a situation where an external force acts on the window member can be curbed, and the window member can be reliably protected. In addition, the thickness of the protrusion is smaller than the height of the protrusion from the top surface. Accordingly, the main body portion and the protrusion can be formed to be small, and the amount of thermal deformation of the main body portion and the protrusion can be reduced. As a result, having a situation where stress acts on the window member when the main body portion and the protrusion are thermally deformed can be curbed. Therefore, the window member can be formed to be thin, and an influence of refraction at the window member can be reduced. In addition, even if the window member is formed to be thin, warp deformation of the window member due to thermal deformation of the main body portion and the protrusion can be curbed. Moreover, since the thickness of the protrusion is smaller than the height of the protrusion from the top surface, the protrusion is likely to warp. For this reason, for instance, even if the main body portion and the protrusion are thermally deformed and the protrusion comes into contact with the window member, stress is unlikely to be transferred from the protrusion to the window member. According to this as well, an influence of refraction at the window member can be reduced by forming the window member to be thin, and warp deformation of the window member due to thermal deformation of the main body portion and the protrusion can be curbed. Hence, according to this minor unit, highly accurate light scanning can be realized while the window member is reliably protected.

A gap may be formed between a side surface of the window member and an inner surface of the protrusion. In this case, even if the main body portion and the protrusion are thermally deformed, the protrusion is unlikely to come into contact with the window member. Therefore, having a situation where stress acts on the window member can be further curbed.

The thickness of the protrusion may be smaller than a thickness of the window member. In this case, having a situation where stress acts on the window member when the main body portion and the protrusion are thermally deformed can be far further curbed.

The light scanning device may be held by the main body portion in a state where a minor surface of the movable mirror portion is inclined with respect to the window member. In this case, having a situation where light from the minor surface returns to the minor surface after being reflected by the window member can be curbed. Meanwhile, in this case, an incident angle of light with respect to the window member becomes larger. In contrast, in this minor unit, having a situation where stress acts on the window member when the main body portion and the protrusion are thermally deformed can be sufficiently curbed, and thus highly accurate light scanning can be realized.

The protrusion may be integrally formed with the main body portion. In this case, damage to the protrusion by being pressed by the window member when the main body portion and the protrusion are thermally deformed can be curbed.

At least one of the main body portion and the protrusion may be formed of a resin. In this case, although at least one of the main body portion and the protrusion is likely to be thermally deformed, in this minor unit, having a situation where stress acts on the window member when the main body portion and the protrusion are thermally deformed can be sufficiently curbed, and thus highly accurate light scanning can be realized.

An abutment portion including a flat abutment surface facing the one side may be provided on the top surface of the main body portion in a protruding manner. The window member may be in contact with the abutment surface. In this case, the window member is positionally set with respect to the main body portion due to contact with the abutment surface. Therefore, deviation of a disposition angle of the window member from a desired angle can be curbed. In addition, although it is difficult to form a surface of the window member to be completely flat, in this minor unit, at least a contact location with respect to the abutment surface need only be formed to be flat. Therefore, manufacturing of the window member can be facilitated.

A gap may be formed between the window member and the top surface of the main body portion. In this case, having a situation where stress acts on the window member when the main body portion and the protrusion are thermally deformed can be far further curbed. In addition, the gap can function as a ventilation port, and occurrence of dew condensation inside the package can be curbed.

The protrusion may be formed in a ring shape when viewed in the predetermined direction. In this case, the window member can be more reliably protected.

Advantageous Effects of Invention

According to the aspect of the present disclosure, it is possible to provide a minor unit in which highly accurate light scanning can be realized while a window member is reliably protected.

DESCRIPTION OF EMBODIMENT

Figure 1:
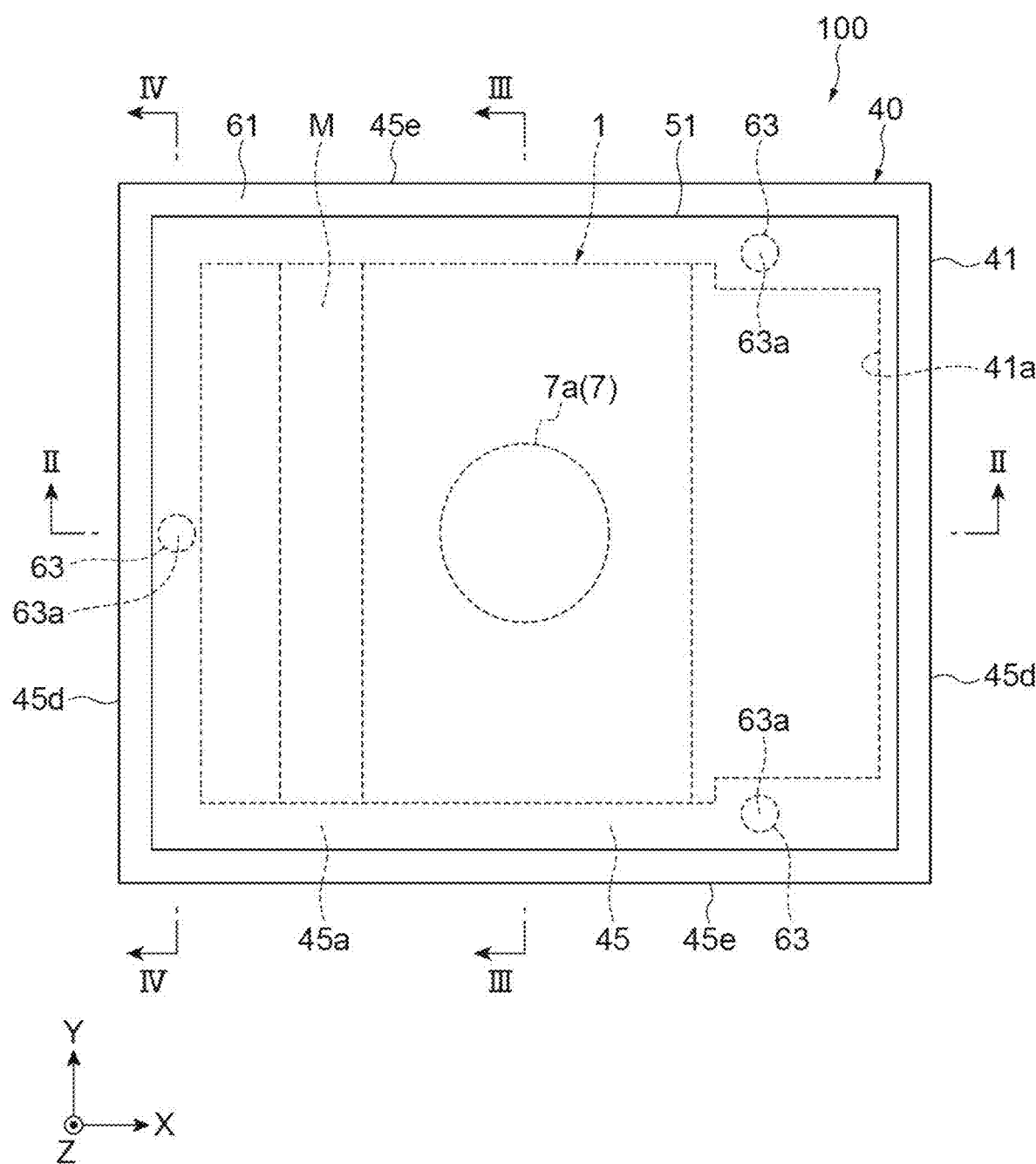
FIG. 1 is a plan view of a minor unit according to an embodiment.

Hereinafter, an embodiment of the present disclosure will be described in detail with reference to the drawings. In the following description, the same reference signs are used for elements which are the same or corresponding, and duplicate description thereof will be omitted.

[Overall Configuration of Minor Unit]

As illustrated in FIGS. 1 to 4, a minor unit 100 includes a light scanning device 1, and a package 40 accommodating the light scanning device 1. The package 40 has a main body portion 41 and a window member 51. The main body portion 41 is provided with an light incident opening 41a that opens on one side S1 in a predetermined direction (Z axis direction). The main body portion 41 holds the light scanning device 1 such that light incident from the light incident opening 41a can be incident on the light scanning device 1. The window member 51 is disposed such that the light incident opening 41a is covered.

[Configuration of Light Scanning Device]

Figure 5:
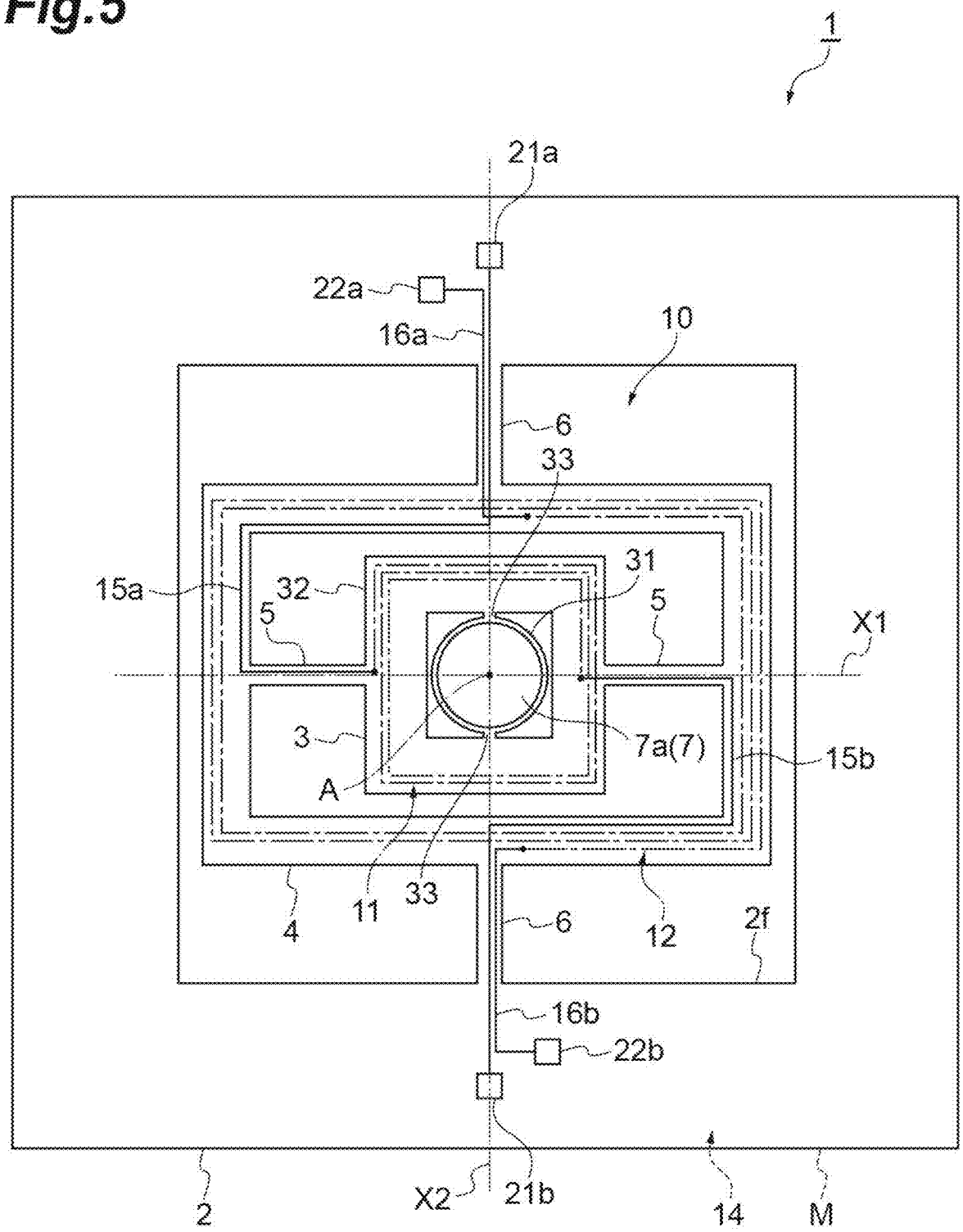
FIG. 5 is a plan view of a light scanning device.

As illustrated in FIG. 5, the light scanning device 1 has a support portion 2, a movable mirror portion 10 which can swing with respect to the support portion 2, and a magnetic field generation portion M. The movable minor portion 10 has a first movable portion 3, a second movable portion 4, a pair of first joint portions 5, a pair of second joint portions 6, and a minor 7. The support portion 2, the first movable portion 3, the second movable portion 4, the pair of first joint portions 5, and the pair of second joint portions 6 are integrally formed on a silicon-on-insulator (SOI) substrate, for example. Namely, the light scanning device 1 is configured as a MEMS device. For example, the magnetic field generation portion M is configured to include permanent magnetics in a Halbach array and is formed to have substantially a rectangular parallelepiped shape.

For example, the first movable portion 3 is formed to have a rectangular plate shape. The second movable portion 4 is formed to have a rectangular ring shape, for example, such that the first movable portion 3 is surrounded via a gap when viewed in an optical axis direction A. The support portion 2 is formed to have a rectangular frame shape, for example, such that the second movable portion 4 is surrounded via a gap when viewed in the optical axis direction A. Namely, the support portion 2 is formed to have a frame shape such that the first movable portion 3 and the second movable portion 4 are surrounded when viewed in the optical axis direction A.

The first movable portion 3 is joined to the second movable portion 4 via the pair of first joint portions 5 such that it can swing around a first axis X1. Namely, the first movable portion 3 is supported by the support portion 2 such that it can swing around the first axis X1. The first movable portion 3 includes a first part 31 and a second part 32. The first part 31 is formed to have a circular shape, for example, when viewed in the optical axis direction A. The second part 32 is formed to have a rectangular ring shape, for example, when viewed in the optical axis direction A. The first part 31 is surrounded by the second part 32 when viewed in the optical axis direction A and is connected to the second part 32 via a plurality of (two in this example) connection parts 33. Namely, a gap is formed between the first part 31 and the second part 32 excluding the plurality of connection parts 33.

For example, the connection parts 33 are positioned at middle portions of two sides intersecting a second axis X2 in inner edges of the rectangular shape of the second part 32. That is, in this example, the connection parts 33 are positioned on the second axis X2. The first part 31 need only be connected to the second part 32 in at least a direction along the second axis X2.

The second movable portion 4 is joined to the support portion 2 via the pair of second joint portions 6 such that it can swing around the second axis X2. Namely, the second movable portion 4 is supported by the support portion 2 such that it can swing around the second axis X2. The first axis X1 and the second axis X2 are perpendicular to the optical axis direction A and intersect each other (orthogonal to each other in this example). The first part 31 may be formed to have a rectangular shape or a polygonal shape when viewed in the optical axis direction A. The first part 31 may be formed to have a circular shape (for example, an elliptical shape) when viewed in the optical axis direction A. The second part 32 may be formed to have a polygonal ring shape that is a pentagonal shape or a shape having more angles, or an annular shape when viewed in the optical axis direction A.

The pair of first joint portions 5 are disposed on the first axis X1 such that the first movable portion 3 is sandwiched therebetween in a gap between the second part 32 of the first movable portion 3 and the second movable portion 4. Each of the first joint portions 5 functions as a torsion bar. The pair of second joint portions 6 are disposed on the second axis X2 such that the second movable portion 4 is sandwiched therebetween in a gap between the second movable portion 4 and the support portion 2. Each of the second joint portions 6 functions as a torsion bar.

The minor 7 is provided in the first part 31 of the first movable portion 3. The minor 7 is formed on a surface of the first part 31 on a side opposite to the magnetic field generation portion M such that an intersection between the first axis X1 and the second axis X2 is included. For example, the minor 7 is formed to have a circular, elliptical, or rectangular film shape using a metal material such as aluminum, an aluminum-based alloy, gold, or silver. A surface of the mirror 7 on a side opposite to the first movable portion 3 constitutes a mirror surface 7a extending perpendicularly to the optical axis direction A. The center of the minor 7 coincides with the intersection between the first axis X1 and the second axis X2 when viewed in the optical axis direction A. In this manner, the minor 7 is provided in the first part 31 connected to the second part 32 via the plurality of connection parts 33. Therefore, even if the first movable portion 3 swings around the first axis X1 at a resonance frequency level, occurrence of deformation such as warpage in the minor 7 can be curbed.

Figure 2:
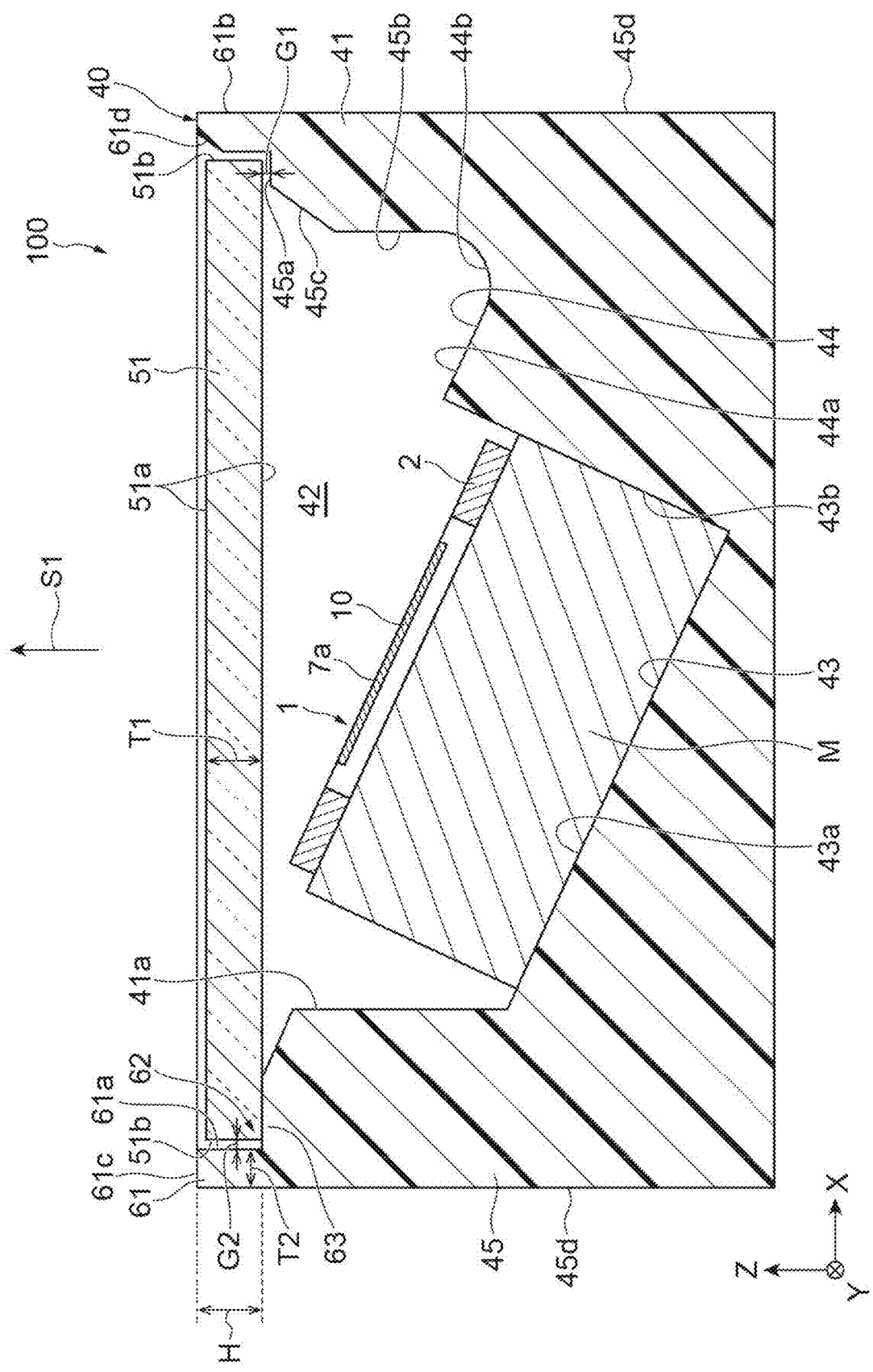
FIG. 2 is a cross-sectional view along line II-II in FIG. 1.
Figure 3:
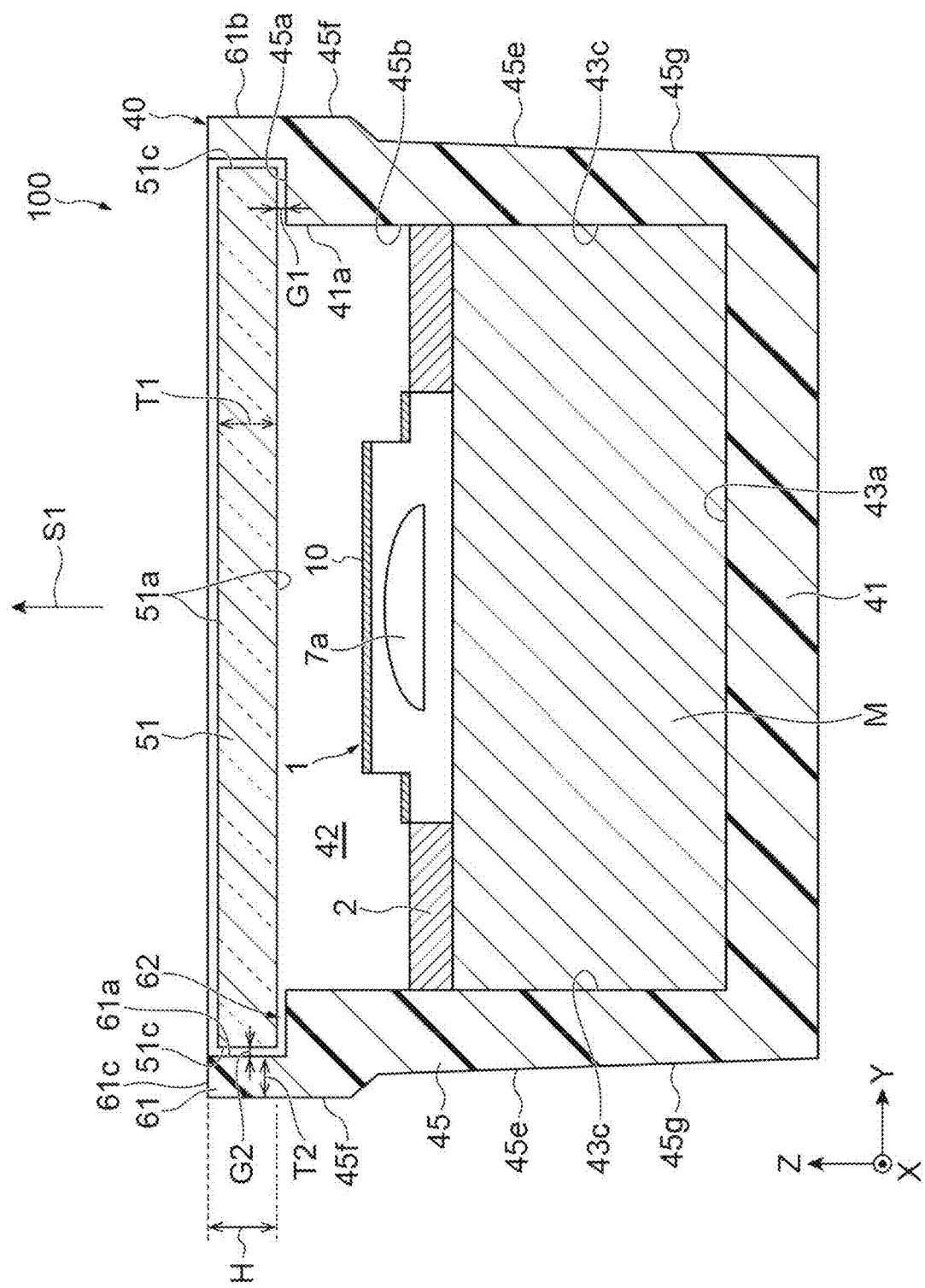
FIG. 3 is a cross-sectional view along line III-III in FIG. 1.
Figure 4:
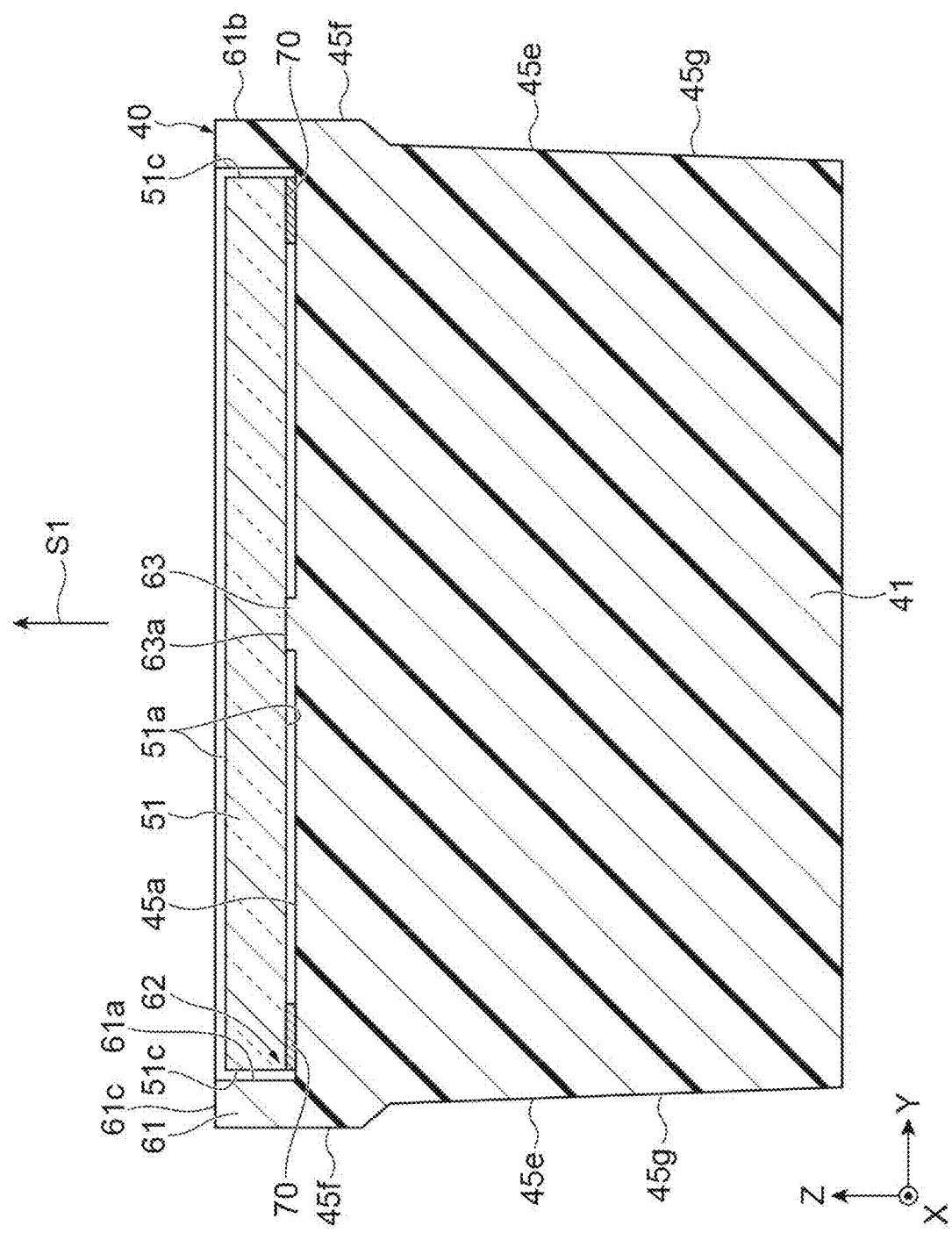
FIG. 4 is a cross-sectional view along IV-IV in FIG. 1.

Moreover, the light scanning device 1 has a first driving coil 11, a second driving coil 12, wirings 15a and 15b, wirings 16a and 16b, electrode pads 21a and 21b, and electrode pads 22a and 22b. In FIG. 2, for the sake of convenience of description, the first driving coil 11 and the second driving coil 12 are indicated by one-dot dashed lines, and the wirings 15a and 15b and the wirings 16a and 16b are indicated by solid lines.

The first driving coil 11 is provided in the second part 32 of the first movable portion 3. The first driving coil 11 is wound a plurality of times in a spiral shape (helical shape) in a region of the minor 7 on an outward side (that is, the second part 32) when viewed in the optical axis direction A. A magnetic field generated by the magnetic field generation portion M acts on the first driving coil 11.

The first driving coil 11 is disposed inside a groove formed on a surface of the first movable portion 3. Namely, the first driving coil 11 is embedded into the first movable portion 3. One end of the first driving coil 11 is connected to the electrode pad 21a via the wiring 15a. The wiring 15a extends from the first movable portion 3 to the support portion 2 via the first joint portion 5 on one side, the second movable portion 4, and the second joint portion 6 on one side. For example, the wiring 15a and the electrode pad 21a are integrally formed of a metal material such as tungsten, aluminum, gold, silver, copper, or an aluminum-based alloy. The first driving coil 11 and the wiring 15a are connected to each other.

The other end of the first driving coil 11 is connected to the electrode pad 21b via the wiring 15b. The wiring 15b extends from the first movable portion 3 to the support portion 2 via the first joint portion 5 on the other side, the second movable portion 4, and the second joint portion 6 on the other side. For example, the wiring 15b and the electrode pad 21b are integrally formed of a metal material such as tungsten, aluminum, gold, silver, copper, or an aluminum-based alloy. The first driving coil 11 and the wiring 15b are connected to each other.

The second driving coil 12 is provided in the second movable portion 4. The second driving coil 12 is wound a plurality of times in a spiral shape (helical shape) in the second movable portion 4. A magnetic field generated by the magnetic field generation portion M acts on the second driving coil 12. The second driving coil 12 is disposed inside a groove formed on a surface of the second movable portion 4. Namely, the second driving coil 12 is embedded into the second movable portion 4.

One end of the second driving coil 12 is connected to the electrode pad 22a via the wiring 16a. The wiring 16a extends from the second movable portion 4 to the support portion 2 via the second joint portion 6 on one side. For example, the wiring 16a and the electrode pad 22a are integrally formed of a metal material such as tungsten, aluminum, gold, silver, copper, or an aluminum-based alloy. The second driving coil 12 and the wiring 16a are connected to each other.

The other end of the second driving coil 12 is connected to the electrode pad 22b via the wiring 16b. The wiring 16b extends from the second movable portion 4 to the support portion 2 via the second joint portion 6 on the other side. For example, the wiring 16b and the electrode pad 22b are integrally formed of a metal material such as tungsten, aluminum, gold, silver, copper, or an aluminum-based alloy. The second driving coil 12 and the wiring 16b are connected to each other.

Examples of operation of the movable minor portion 10 in the light scanning device 1 will be presented. Regarding a first example, a high-frequency driving current is applied to the first driving coil 11. At this time, a magnetic field generated by the magnetic field generation portion M acts on the first driving coil 11. Therefore, a Lorentz force is generated in the first driving coil 11. Accordingly, for example, the first movable portion 3 is caused to swing around the first axis X1 at a resonance frequency level.

In addition, a driving current having a certain magnitude is applied to the second driving coil 12. At this time, a magnetic field generated by the magnetic field generation portion M acts on the second driving coil 12. Therefore, a Lorentz force is generated in the second driving coil 12. Accordingly, for example, the second movable portion 4 is rotated around the second axis X2 in accordance with the magnitude of a driving current and is stopped in this state. Accordingly, according to the light scanning device 1, scanning can be performed while light from a predetermined light source is reflected by the minor 7. In the first example, the first movable portion 3 is caused to swing at a resonance frequency, and the second movable portion 4 is used statically.

Regarding a second example, similar to operation of the first movable portion 3 in the first example, the first movable portion 3 is caused to swing in accordance with a resonance frequency due to a high-frequency driving current applied to the first driving coil 11, and the second movable portion 4 is caused to swing in accordance with a resonance frequency due to a high-frequency driving current applied to the second driving coil 12. In this manner, in the second example, both the first movable portion 3 and the second movable portion 4 are caused to swing at a resonance frequency.

Regarding a third example, similar to operation of the second movable portion 4 in the first example, the first movable portion 3 is rotated around the first axis X1 in accordance with the magnitude of a driving current due to a driving current having a certain magnitude applied to the first driving coil 11 and is stopped, and the second movable portion 4 is rotated around the second axis X2 in accordance with the magnitude of a driving current due to a driving current having a certain magnitude applied to the second driving coil 12 and is stopped. In this manner, in the third example, both the first movable portion 3 and the second movable portion 4 are used statically.

Regarding a fourth example, for example, in such a case where the second movable portion 4 is not provided, only the first movable portion 3 is caused to swing in accordance with a resonance frequency due to a high-frequency driving current applied to the first driving coil 11. Moreover, regarding a fifth example, in a similar case, the first movable portion 3 is rotated around the first axis X1 in accordance with the magnitude of a driving current due to a driving current having a certain magnitude applied to the first driving coil 11 and is stopped. In the fourth example and the fifth example, only the first movable portion 3 is driven.

As illustrated in FIG. 2, the support portion 2 is supported by the magnetic field generation portion M, and the first movable portion 3 and the second movable portion 4 are separated from the magnetic field generation portion M. Accordingly, the first movable portion 3 and the second movable portion 4 can rotate without interfering with the magnetic field generation portion M.

[Configuration of Package]

As illustrated in FIGS. 1 to 4, the main body portion 41 of the package 40 is formed to have substantially a rectangular parallelepiped shape, for example. The main body portion 41 is formed of a resin material such as polyphenylene sulfide (PPS) or polypropylene (PP), for example, and is formed through injection molding. The main body portion 41 may be subjected to filler reinforcement when it is formed of a resin material. The main body portion 41 may be formed of a metal material such as Al, Fe, or an alloy thereof. A recessed portion 42 opening on the one side S1 is formed in the main body portion 41. The light incident opening 41a described above is configured by an opening of the recessed portion 42.

For example, the window member 51 is configured by forming an antireflective film on both surfaces of a rectangular flat plate-shaped base material formed of a translucent material such as glass. As described above, the window member 51 covers the light incident opening 41a. The window member 51 has a pair of main surfaces 51a extending perpendicularly to the Z axis direction, a pair of side surfaces 51b extending perpendicularly to an X axis direction, and a pair of side surfaces 51c extending perpendicularly to a Y axis direction. The pair of side surfaces 51b and the pair of side surfaces 51c continue to the pair of main surfaces 51a.

The recessed portion 42 of the main body portion 41 includes a device disposition portion 43 in which the light scanning device 1 is disposed, and a wiring disposition portion 44 in which wirings extending to the outside from the light scanning device 1, and the like are disposed. The device disposition portion 43 has a first surface 43a extending so as to be inclined with respect to the main surfaces 51a of the window member 51, a second surface 43b extending perpendicularly to the first surface 43a from the first surface 43a, and a pair of third surfaces 43c extending perpendicularly to the Z axis direction from the first surface 43a.

The light scanning device 1 is disposed in the device disposition portion 43 in a state where the magnetic field generation portion M is in contact with the first surface 43a, the second surface 43b, and the pair of third surfaces 43c. Accordingly, the light scanning device 1 is in a state where the minor surface 7a of the movable minor portion 10 is inclined with respect to the main surfaces 51a of the window member 51. For example, the light scanning device 1 is disposed such that the first axis X1 is parallel to the X axis direction and the second axis X2 is parallel to the Y axis direction.

The wiring disposition portion 44 has a first surface 44a which is inclined with respect to the main surfaces 51a of the window member 51, and a second surface 44b which continues to the first surface 44a and is curved. For example, a plurality of electrode pads are disposed on the first surface 44a. The wirings extending from the light scanning device 1 and the wirings passing through the second surface 44b and extending to the outside of the package 40 are electrically connected to these electrode pads. The second surface 44b may not necessarily be curved.

The light incident opening 41a exhibits substantially a rectangular shape when viewed in the Z axis direction (in other words, when viewed in a direction perpendicular to the main surfaces 51a of the window member 51). More specifically, the light incident opening 41a includes a rectangular region corresponding to the device disposition portion 43 and a rectangular region corresponding to the wiring disposition portion 44 when viewed in the Z axis direction. A width of the region corresponding to the wiring disposition portion 44 in the Y axis direction is smaller than a width of the region corresponding to the device disposition portion 43 in the Y axis direction. In FIG. 1, an edge of the light incident opening 41a is indicated by a dotted line.

The main body portion 41 has a frame-shaped side wall 45 defining the recessed portion 42. The side wall 45 exhibits substantially a rectangular ring shape and surrounds the light scanning device 1 when viewed in the Z axis direction. The side wall 45 has a top surface 45a positioned farthest on the one side S1, an inner surface 45b extending along the Z axis direction, and an inclined surface 45c connected to the top surface 45a and the inner surface 45b. The top surface 45a extends perpendicularly to the Z axis direction, and the inclined surface 45c extends in a manner of being inclined with respect to the Z axis direction such that it goes closer to the one side S1 as it goes closer to the top surface 45a.

In addition, the side wall 45 has a pair of outer surfaces 45d extending along a plane intersecting the X axis direction, and a pair of outer surfaces 45e extending along a plane intersecting the Y axis direction. In this example, the pair of outer surfaces 45d extend perpendicularly to the X axis direction. Each of the pair of outer surfaces 45e includes a first part 45f extending parallel to the Z axis direction, and a second part 45g extending in a manner of being inclined with respect to the Z axis direction.

The second parts 45g are disposed on the other side with respect to the first parts 45f (a side opposite to the one side S1) and extend to an end portion of the main body portion 41 on the other side. Since the second parts 45g are formed, the width of the main body portion 41 (side wall 45) in the Y axis direction becomes smaller as it goes closer to the other side. Accordingly, when the main body portion 41 is formed by injection molding, a molded product can be easily taken out from a molding die. In addition, since not only the second parts 45g but also the first parts 45f parallel to the Z axis direction are formed, the minor unit 100 can be positionally aligned by pressing the first parts 45f when the minor unit 100 is incorporated into an optical system, and thus positional alignment accuracy of the mirror unit 100 can be improved.

The package 40 further has a protrusion 61 provided on the top surface 45a of the side wall 45. The protrusion 61 extends along the edge of the light incident opening 41a. The protrusion 61 exhibits a rectangular ring shape and surrounds the light incident opening 41a when viewed in the Z axis direction. Since the protrusion 61 is formed, a stepped portion 62 is formed between an inner surface 61a of the protrusion 61 and the top surface 45a.

The protrusion 61 extends along an outer edge of the top surface 45a. When viewed in the Y axis direction (FIG. 2), outer surfaces 61b of the protrusion 61 are positioned on the same plane as the outer surfaces 45d of the side wall 45. When viewed in the X axis direction (FIG. 3), the outer surfaces 61b of the protrusion 61 are positioned on the same plane as the first parts 45f on the outer surfaces 45e of the side wall 45. For example, the protrusion 61 is formed of the same resin material as the main body portion 41 and is integrally formed with the main body portion 41. For example, the main body portion 41 and the protrusion 61 are formed at the same time through single injection molding and constitute a single member.

Three abutment portions 63 are provided on the top surface 45a of the side wall 45. Each of the abutment portions 63 is disposed on an inward side than the protrusion 61 when viewed in the Z axis direction. Each of the abutment portions 63 has a flat abutment surface 63a facing the one side S1. For example, the abutment surface 63a extends perpendicularly to the Z axis direction and exhibits a circular shape.

The window member 51 is disposed at the stepped portion 62 such that the light incident opening 41a is covered. That is, the window member 51 is disposed on the top surface 45a on the inward side of the protrusion 61 and covers the light incident opening 41a. One of the pair of main surfaces 51a of the window member 51 (which may hereinafter be simply stated as the main surface 51a) faces the top surface 45a of the side wall 45, and the side surfaces 51b and 51c of the window member 51 face the inner surface 61a of the protrusion 61. The main surfaces 51a of the window member 51 are in contact with (are caused to abut) the abutment surfaces 63a of the abutment portions 63. Accordingly, in a region where the abutment surfaces 63a are not provided on the top surface 45a, gaps G1 are formed between the main surfaces 51a of the window member 51 and the top surface 45a. In addition, gaps G2 are formed between the side surfaces 51b and 51c of the window member 51 and the inner surface 61a of the protrusion 61. That is, the side surfaces 51b and 51c are apart from the inner surface 61a.

For example, the window member 51 is bonded to the main body portion 41 using a bonding material 70 such as a low melting point glass. For example, the window member 51 is bonded to the main body portion 41 at four corner portions when viewed in the Z axis direction. In addition to or in place of four corner portions, the window member 51 may be bonded to the main body portion 41 using a bonding material at contact parts with the abutment surfaces 63a.

An end surface 61c of the protrusion 61 on the one side S1 is positioned more to the one side S1 than the window member 51 throughout the whole circumference (at any position on the end surface 61c). That is, a height H of the protrusion 61 from the top surface 45a is larger than the sum of a thickness (distance between the pair of main surfaces 51a) T1 of the window member 51 and a height of the abutment portions 63 from the top surface 45a (length of the gaps G1 in the Z axis direction). For example, the thickness T1 of the window member 51 is approximately 0.6 mm.

A thickness T2 of the protrusion 61 is smaller than the height H of the protrusion 61 from the top surface 45a. The thickness T2 of the protrusion 61 is smaller than the thickness T1 of the window member 51. The thickness T2 of the protrusion 61 is a thickness in a direction perpendicular to an extending direction of the protrusion 61. For example, it is a thickness in the X axis direction at a part extending perpendicularly to the X axis direction in the protrusion 61, and it is a thickness in the Y axis direction at a part extending perpendicularly to the Y axis direction. The thickness T2 of the protrusion 61 is the largest thickness of the protrusion 61. For example, when a part of the protrusion 61 is formed to have a tapered shape as in the embodiment, the thickness T2 of the protrusion 61 is a thickness of the thickest part in the protrusion 61. In this example, one of a pair of parts in the protrusion 61 extending in the Y axis direction is formed to have a tapered shape and has an inclined surface 61*d*. Accordingly, work of disposing the window member 51 in the stepped portion 62 can be facilitated. In addition, the protrusion 61 can be likely to be subjected to warp deformation.

As described above, the protrusion 61 exhibits a rectangular ring shape when viewed in the Z axis direction, and the window member 51 is surrounded by the protrusion 61 throughout the whole circumference. In addition, as described above, the end surface 61*c* of the protrusion 61 on the one side S1 is positioned more to the one side S1 than the window member 51 throughout the whole circumference. Therefore, when viewed in any direction perpendicular to the Z axis direction, the entirety of the window member 51 is covered by the protrusion 61. In other words, when viewed in any direction perpendicular to the Z axis direction, the window member 51 is not exposed from the protrusion 61. That is, when viewed in any direction perpendicular to the Z axis direction, the length of a part covered by the protrusion 61 in the window member 51 is longer than a length of a part exposed from the protrusion 61 in the window member 51. In this example, the entirety of the window member 51 is covered by the protrusion 61, and the window member 51 does not have a part exposed from the protrusion 61. In this manner, the configuration in which "when viewed in any direction perpendicular to the Z axis direction, the length of a part covered by the protrusion 61 in the window member 51 is longer than a length of a part exposed from the protrusion 61 in the window member 51" includes a case where the entirety of the window member 51 is covered by the protrusion 61 and the window member 51 does not have a part exposed from the protrusion 61.

[Traveling Path of Light in Minor Unit]

Figure 6:
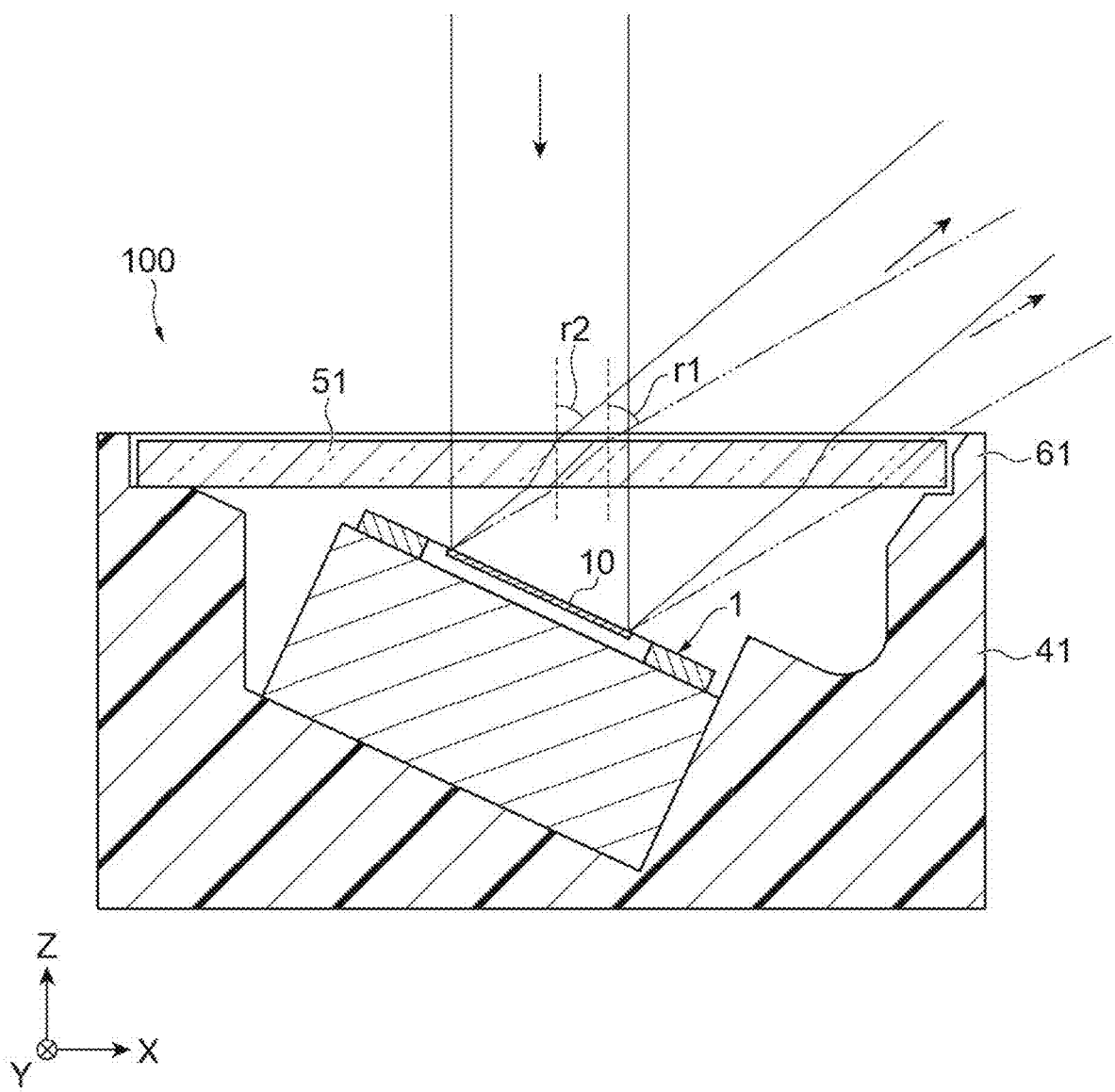
FIG. 6 is a cross-sectional view illustrating an example of a traveling path of light in the minor unit.
Figure 7:
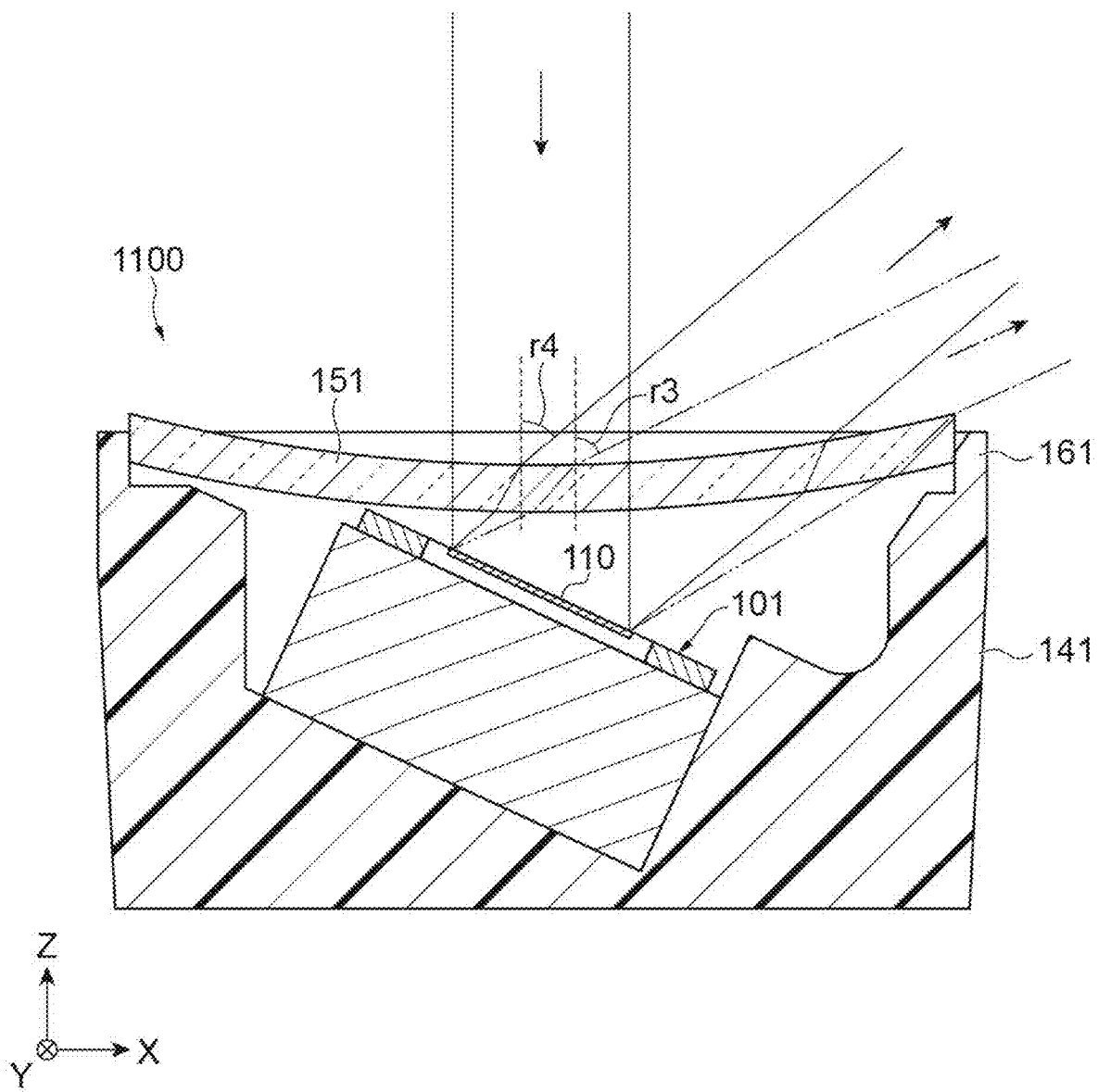
FIG. 7 is a cross-sectional view illustrating an example of a traveling path of light in a minor unit according to a comparative example.
Figure 8:
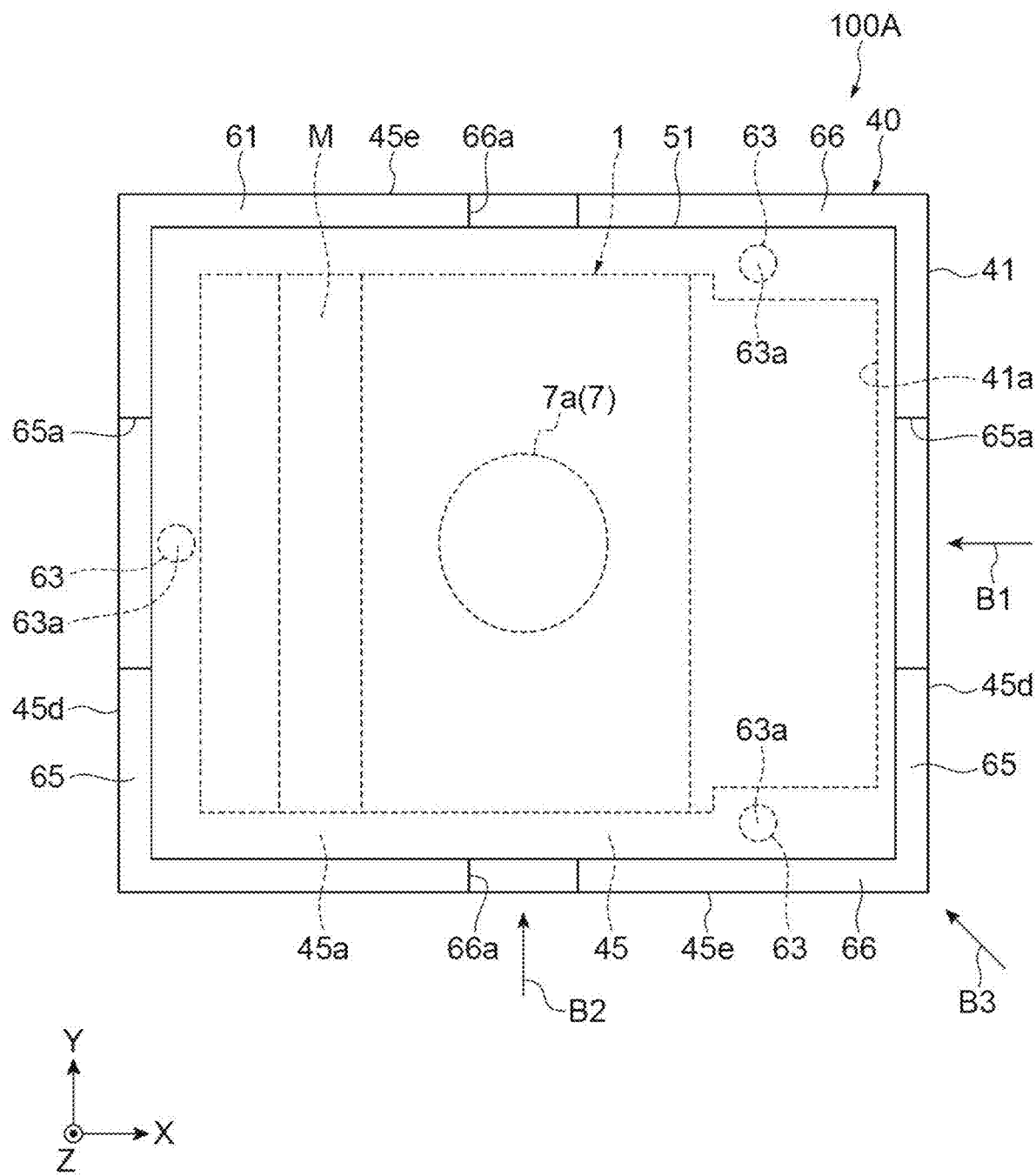
FIG. 8 is a plan view of a minor unit according to a first modification example.

With reference to FIGS. 6 and 7, examples of a traveling path of light in the minor unit 100 will be described. In FIGS. 6 and 7, examples of a traveling path of light in a state where the movable minor portion 10 or a movable mirror portion 110 is not operated are indicated by solid lines, and examples of a traveling path of light in a state where the movable minor portion 10 or the movable minor portion 110 is operated are indicated by dotted lines. FIG. 6 illustrates an example of a case where the window member 51 is flat without warping in the minor unit 100 according to the embodiment, and FIG. 7 illustrates an example of a case where a window member 151 has warped toward a light scanning device 101 side in a minor unit 1100 according to a comparative example.

In the minor unit 100, light is incident on the movable mirror portion 10 of the light scanning device 1 from the outside via the window member 51, is reflected by the movable minor portion 10, and is emitted to the outside via the window member 51. As illustrated in FIG. 6, a refractive angle r1 of light emitted from the window member 51 in a state where the movable minor portion 10 is operated may be larger than a refractive angle r2 of light emitted from the window member 51 in a state where the movable minor portion 10 is not operated. For this reason, in order to realize highly accurate light scanning in the mirror unit 100, there is a need to consider an influence of refraction on the window member 51.

In the minor unit 1100 according to the comparative example illustrated in FIG. 7, for example, when a main body portion 141 and a protrusion 161 are thermally deformed (thermally contracts or thermally expands), it is conceivable that the window member 151 warp due to pressurization of the protrusion 161. In this case, a refractive angle r3 of light emitted from the window member 151 in a state where the window member 151 has warped becomes larger than a refractive angle r4 of light emitted from the window member 151 in a state where the window member 151 has not warped. In this manner, if warpage occurs in the window member 151, the refractive angle of light in the window member 151 changes. Therefore, it is difficult to accurately perform light scanning.

Particularly, when an incident angle of light with respect to the window member and an emission angle of light from the window member increase, an influence of warp deformation of the window member on accuracy of light scanning increases. Therefore, in a mirror unit including a light scanning device in which light scanning is performed by swinging a movable minor portion, the incident angle of light with respect to the window member increases according to the angle of the movable minor portion, and the refractive angle of light emitted from the window member increases. Therefore, it is highly necessary to curb warp deformation of the window member. In the foregoing example, a case where light is incident on the window member 51 (window member 151) from the front side and is emitted to a lateral side has been described, but the same applies to a case where light is incident on the window member 51 (window member 151) from a lateral side and is emitted to the front side.

[Functions and Effects]

In the minor unit 100 according to the embodiment, the protrusion 61 is provided on the top surface 45*a* of the main body portion 41 so as to extend along the edge of the light incident opening 41*a*, and the window member 51 is disposed on the top surface 45*a* on the inward side of the protrusion 61. Further, the end surface 61*c* of the protrusion 61 on the one side S1 is positioned more to the one side S1 than the window member 51. In addition, when viewed in any direction perpendicular to the Z axis direction, the length of a part covered by the protrusion 61 in the window member 51 is longer than the length of a part exposed from the protrusion 61 in the window member 51.

Accordingly, having a situation where an external force acts on the window member 51 can be curbed, and the window member can be reliably protected. In addition, the minor unit 100 can be positionally aligned by pressing the end surface 61*c* of the protrusion 61 when the minor unit 100 is incorporated into the optical system. For this reason, for example, compared to a case where the window member 51 is positioned more to the one side S1 than the end surface 61*c* of the protrusion 61 and the minor unit 100 is positionally aligned by pressing the window member 51, positional alignment accuracy of the mirror unit 100 can be improved. This is because deviation is likely to occur at the position of the window member 51 due to a manufacturing tolerance of the window member 51 and a tolerance in thickness of the bonding material for bonding the window member 51 and the main body portion 41 to each other.

In addition, the thickness T2 of the protrusion 61 is smaller than the height H of the protrusion 61 from the top surface 45*a*. Accordingly, the main body portion 41 and the protrusion 61 can be formed to be small, and the amount of thermal deformation of the main body portion 41 and the protrusion 61 can be reduced. That is, if the thickness T2 of the protrusion 61 is reduced, the thickness of the side wall 45 of the main body portion 41 in which the protrusion 61 provided is also reduced. For this reason, the main body portion 41 and the protrusion 61 can be formed to be small by forming the protrusion 61 to have a small thickness T2. As a result, having a situation where stress acts on the window member 51 when the main body portion 41 and the protrusion 61 are thermally deformed can be curbed. Therefore, the window member 51 can be formed to be thin, and an influence of refraction at the window member 51 can be reduced. In addition, even if the window member 51 is formed to be thin, warp deformation of the window member 51 due to thermal deformation of the main body portion 41 and the protrusion 61 can be curbed. Moreover, since the thickness T2 of the protrusion 61 is smaller than the height H of the protrusion 61 from the top surface 45a, the protrusion 61 is likely to warp. For this reason, for instance, even if the main body portion 41 and the protrusion 61 are thermally deformed and the protrusion 61 comes into contact with the window member 51, stress is unlikely to be transferred from the protrusion 61 to the window member 51 (stress is dispersed). According to this as well, an influence of refraction on the window member 51 can be reduced by forming the window member 51 to be thin, and warp deformation of the window member 51 due to thermal deformation of the main body portion 41 and the protrusion 61 can be curbed. Hence, according to the minor unit 100, highly accurate light scanning can be realized while the window member 51 is reliably protected.

In the minor unit 100, the gaps G2 are formed between the side surfaces 51b and 51c of the window member 51 and the inner surface 61a of the protrusion 61. Accordingly, even if the main body portion 41 and the protrusion 61 are thermally deformed, the protrusion 61 is unlikely to come into contact with the window member 51. Therefore, having a situation where stress acts on the window member 51 can be effectively curbed.

In the mirror unit 100, the thickness T2 of the protrusion 61 is smaller than the thickness T1 of the window member 51. Accordingly, having a situation where stress acts on the window member 51 when the main body portion 41 and the protrusion 61 are thermally deformed can be more effectively curbed.

In the minor unit 100, the light scanning device 1 is held by the main body portion 41 in a state where the mirror surface 7a of the movable minor portion 10 is inclined with respect to the window member 51. Accordingly, having a situation where light from the minor surface 7a returns to the mirror surface 7a after being reflected by the window member 51 can be curbed. Meanwhile, in this case, the incident angle of light with respect to the window member 51 becomes larger. In contrast, in the mirror unit 100, having a situation where stress acts on the window member 51 when the main body portion 41 and the protrusion 61 are thermally deformed can be sufficiently curbed, and thus highly accurate light scanning can be realized.

In the mirror unit 100, the protrusion 61 is integrally formed with the main body portion 41. Accordingly, damage to the protrusion 61 due to pressurization of the window member 51 when the main body portion 41 and the protrusion 61 are thermally deformed can be curbed.

In the mirror unit 100, the main body portion 41 and the protrusion 61 are formed of a resin. In this case, although the main body portion 41 and the protrusion 61 are likely to be thermally deformed, in the minor unit 100, having a situation where stress acts on the window member 51 when the main body portion 41 and the protrusion 61 are thermally deformed can be sufficiently curbed, and thus highly accurate light scanning can be realized.

In the minor unit 100, the abutment portions 63 having flat abutment surfaces 63a facing the one side S1 are provided on the top surface 45a of the main body portion 41 in a protruding manner, and the window member 51 is in contact with the abutment surfaces 63a. Accordingly, the window member 51 is positionally set with respect to the main body portion 41 due to contact with the abutment surfaces 63a. Therefore, deviation of a disposition angle of the window member 51 from a desired angle can be curbed. In addition, it is difficult to form the main surfaces 51a of the window member 51 completely flat. However, in this minor unit 100, at least contact locations with respect to the abutment surfaces 63a need only be formed to be flat. Therefore, manufacturing of the window member 51 can be facilitated.

In the minor unit 100, the gap G1 is formed between the window member 51 and the top surface 45a of the main body portion 41. Accordingly, having a situation where stress acts on the window member 51 when the main body portion 41 and the protrusion 61 are thermally deformed can be far further curbed. In addition, the gap G1 can function as a ventilation port, and occurrence of dew condensation inside the package 40 can be curbed.

In the minor unit 100, the protrusion 61 is formed to have a ring shape when viewed in the Z axis direction. Accordingly, the window member 51 can be more reliably protected. In addition, the end surface 61c of the protrusion 61 is positioned on the one side S1 from the window member 51 throughout the whole circumference. Accordingly, corner portions of the window member 51 in their entireties are covered by the protrusion 61. Therefore, the window member 51 can be far more reliably protected.

Modification Examples

In the minor unit 100 according to the embodiment, the protrusion 61 is continuously provided such that the light incident opening 41a is surrounded. However, as in a minor unit 100A according to a first modification example illustrated in FIGS. 8 to 11, the protrusion 61 may be intermittently provided along the edge of the light incident opening 41a. The protrusion 61 has a pair of first parts 65 extending in the Y axis direction, and a pair of second parts 66 extending in the X axis direction. An opening portion 65a is provided at a middle portion of each of the first parts 65. Since the opening portion 65a is provided, each of the first parts 65 is divided into a pair of parts arranged in the Y axis direction. An opening portion 66a is provided at a middle portion of each of the second parts 66. Since the opening portion 66a is provided, each of the second parts 66 is divided into a pair of parts arranged in the X axis direction.

Also in the minor unit 100A, when viewed in any direction perpendicular to the Z axis direction, the length of a part covered by the protrusion 61 in the window member 51 is longer than the length of a part exposed from the protrusion 61 in the window member 51 (a part not covered by the protrusion 61). In other words, when viewed in any direction perpendicular to the Z axis direction, an area of a part covered by the protrusion 61 in the window member 51 is larger than an area of a part exposed from the protrusion 61 in the window member 51.

Figure 9:
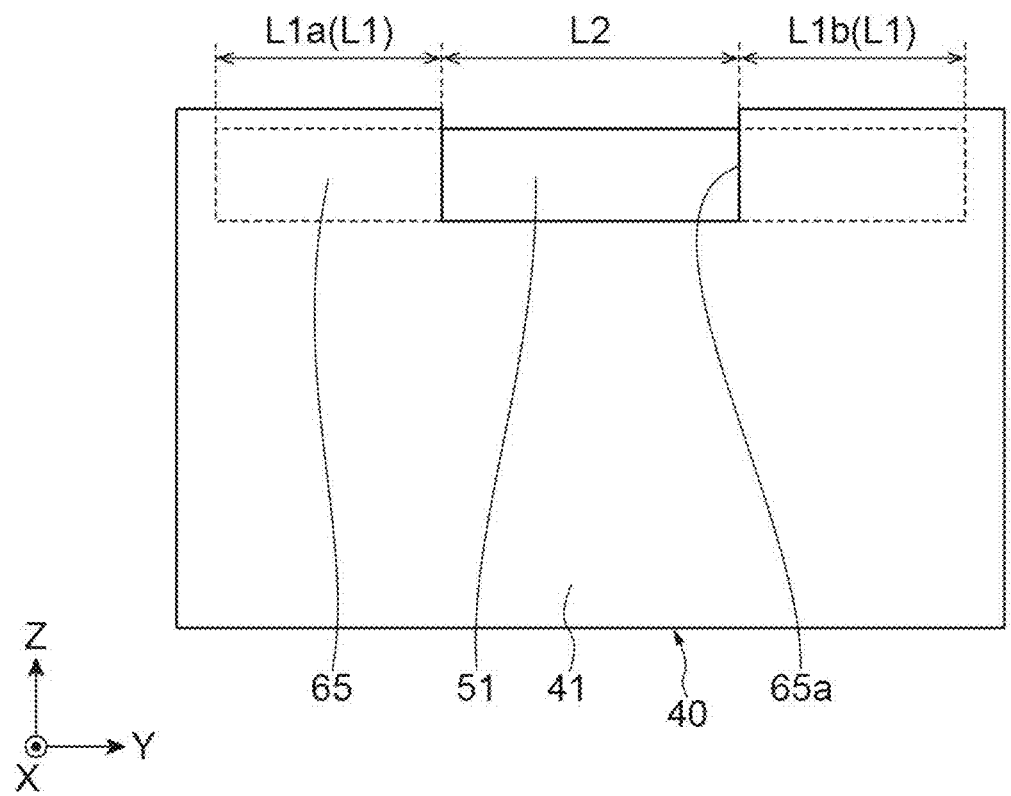
FIG. 9 is a side view of the minor unit viewed from the arrow B1 side illustrated in FIG. 8.

For example, as illustrated in FIG. 9, when viewed from the arrow B1 side, that is, when viewed from one side in the X axis direction perpendicular to the Z axis direction, a length L1 of a part covered by the protrusion 61 in the window member 51 is longer than a length L2 of a part exposed from the protrusion 61 in the window member 51. The length L1 is an overall length of a part covered by the protrusion 61 in the window member 51 and is the total length of lengths L1a and L1b. The length L2 is an overall length of a part exposed from the protrusion 61 in the window member 51. The lengths L1 and L2 are lengths along a direction perpendicular to the Z axis direction and are lengths along the Y axis direction in FIG. 9. Similar to when viewed from the arrow B1 side, when viewed from a side opposite to the arrow B1, that is, when viewed from the other side in the X axis direction perpendicular to the Z axis direction, the length L1 of a part covered by the protrusion 61 in the window member 51 is longer than the length L2 of a part exposed from the protrusion 61 in the window member 51.

Figure 10:
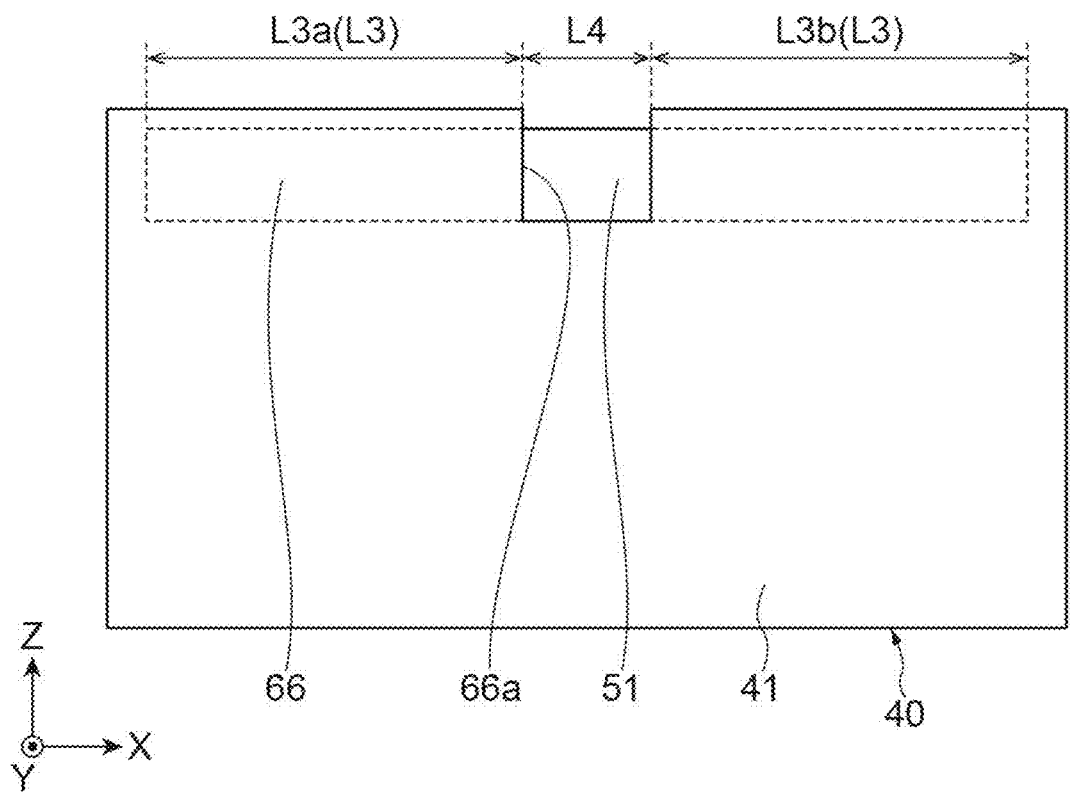
FIG. 10 is a side view of the mirror unit viewed from the arrow B2 side illustrated in FIG. 8.

Regarding another example, as illustrated in FIG. 10, when viewed from the arrow B2 side, that is, when viewed from one side in the Y axis direction perpendicular to the Z axis direction, a length L3 of a part covered by the protrusion 61 in the window member 51 is longer than a length L4 of a part exposed from the protrusion 61 in the window member 51. The length L3 is an overall length of a part covered by the protrusion 61 in the window member 51 and is the total length of lengths L3a and L3b. The length L4 is an overall length of a part exposed from the protrusion 61 in the window member 51. The lengths L3 and L4 are lengths in a direction perpendicular to the Z axis direction and are lengths in the X axis direction in FIG. 10. Similar to when viewed from the arrow B2 side, when viewed from a side opposite to the arrow B2, that is, when viewed from the other side in the Y axis direction perpendicular to the Z axis direction, the length L3 of a part covered by the protrusion 61 in the window member 51 is longer than the length L4 of a part exposed from the protrusion 61 in the window member 51.

Figure 11:
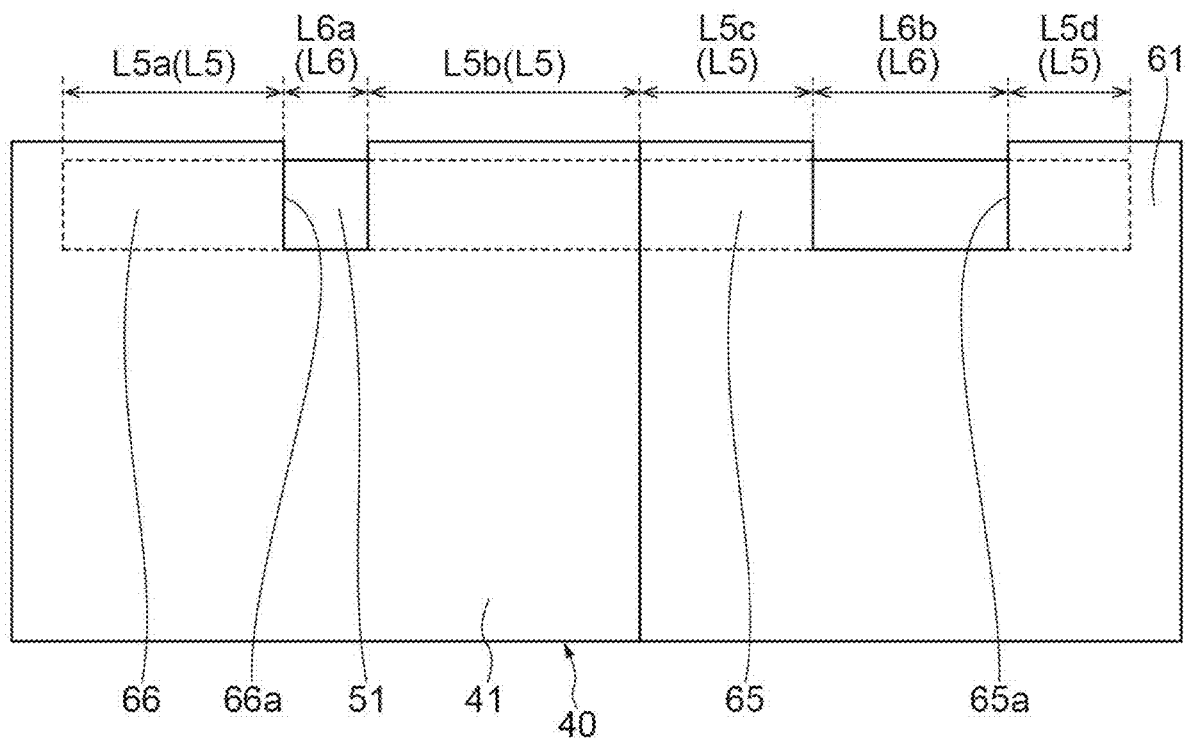
FIG. 11 is a side view of the minor unit viewed from the arrow B3 side illustrated in FIG. 8.

Regarding another example, as illustrated in FIG. 11, when viewed from the arrow B3 side, that is, when viewed in a direction perpendicular to the Z axis direction and inclined with respect to the X axis direction and the Y axis direction, a length L5 of a part covered by the protrusion 61 in the window member 51 is longer than a length L6 of a part exposed from the protrusion 61 in the window member 51. The length L5 is an overall length of a part covered by the protrusion 61 in the window member 51 and is the total length of lengths L5a, L5b, L5c, and L5d. The length L6 is an overall length of a part exposed from the protrusion 61 in the window member 51 and is the total length of lengths L6a and L6b. The lengths L5 and L6 are lengths in a direction perpendicular to the Z axis direction and are lengths in a lateral direction in the diagram, in FIG. 11. In other words, the lengths L5 and L6 are lengths when being projected in a plane perpendicular to the arrow B3. Similar to when viewed from the arrow B3 side, when viewed from a side opposite to the arrow B3, the length L5 of a part covered by the protrusion 61 in the window member 51 is longer than the length L6 of a part exposed from the protrusion 61 in the window member 51.

Also in the mirror unit 100A according to the first modification example, similar to the mirror unit 100 according to the embodiment, highly accurate light scanning can be realized while the window member 51 is reliably protected. In addition, since the protrusion 61 is separated due to the opening portions 65a and 66a, the protrusion 61 can be likely to warp. As a result, even when the window member 51 comes into contact with the protrusion 61, stress acting on the window member 51 from the protrusion 61 is dispersed, and thus damage to the window member 51 can be curbed. In the first modification example, the lengths of the first parts 65 in a transverse direction (length L1a) are larger than the heights of the first parts 65. However, the opening portion 65a may be provided such that the lengths of the first parts 65 in the transverse direction are smaller than the heights of the first parts 65. In this case, a plurality of opening portions 65a may be provided. The same also applies to the second parts 66.

Figure 12:
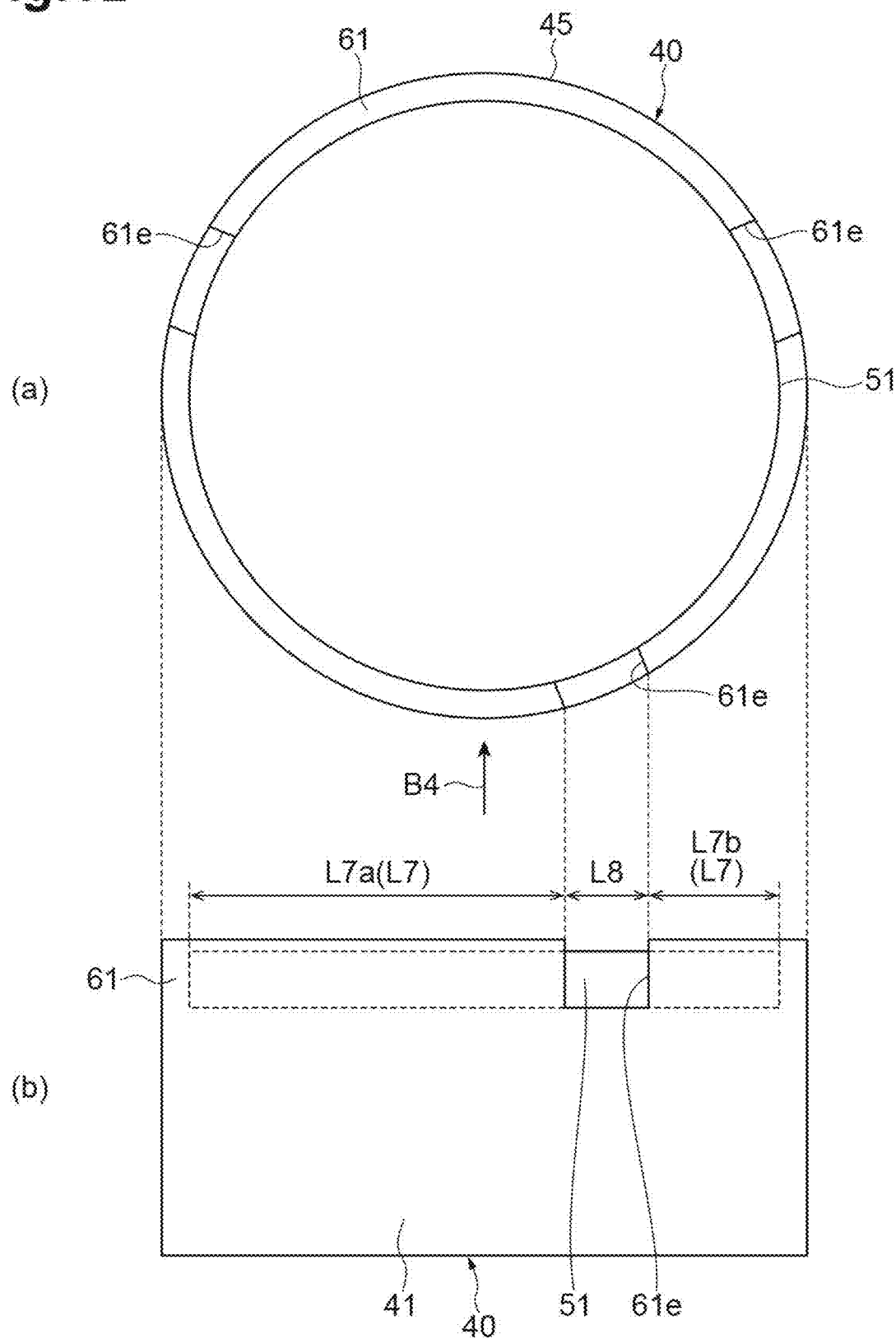
FIG. 12(a) is a plan view of a package according to a second modification example.
FIG. 12(b) is a side view of the package viewed from the arrow B4 side illustrated in FIG. 12(a).

The package 40 may be configured as in a second modification example illustrated in FIGS. 12(a) and 12(b). In the second modification example, the protrusion 61 extends in a circular shape when viewed in the Z axis direction. A plurality of (three in this example) opening portions 61e are provided in the protrusion 61 with an interval therebetween in a circumferential direction. Since the opening portions 61e are provided, the protrusion 61 is separated into three parts arranged in the circumferential direction.

Also in the second modification example, when viewed in any direction perpendicular to the Z axis direction, the length of a part covered by the protrusion 61 in the window member 51 is longer than the length of a part exposed from the protrusion 61 in the window member 51 (a part not covered by the protrusion 61).

For example, as illustrated in FIG. 12(b), when viewed from the arrow B4 side, that is, when viewed in one direction perpendicular to the Z axis direction, a length L7 of a part covered by the protrusion 61 in the window member 51 is longer than a length L8 of a part exposed from the protrusion 61 in the window member 51. The length L7 is an overall length of a part covered by the protrusion 61 in the window member 51 and is the total length of lengths L7a and L7b. The length L8 is an overall length of a part exposed from the protrusion 61 in the window member 51. The lengths L7 and L8 are lengths in a direction perpendicular to the Z axis direction and are lengths in the lateral direction in the diagram, in FIG. 12(b). In other words, the lengths L7 and L8 are lengths when being projected in a plane perpendicular to the arrow B4. Similar to when viewed from the arrow B4 side, when viewed in another direction perpendicular to the Z axis direction, the length L7 of a part covered by the protrusion 61 in the window member 51 is longer than the length L8 of a part exposed from the protrusion 61 in the window member 51.

Also in the second modification example, similar to the foregoing embodiment, highly accurate light scanning can be realized while the window member 51 is reliably protected.

Figure 13:
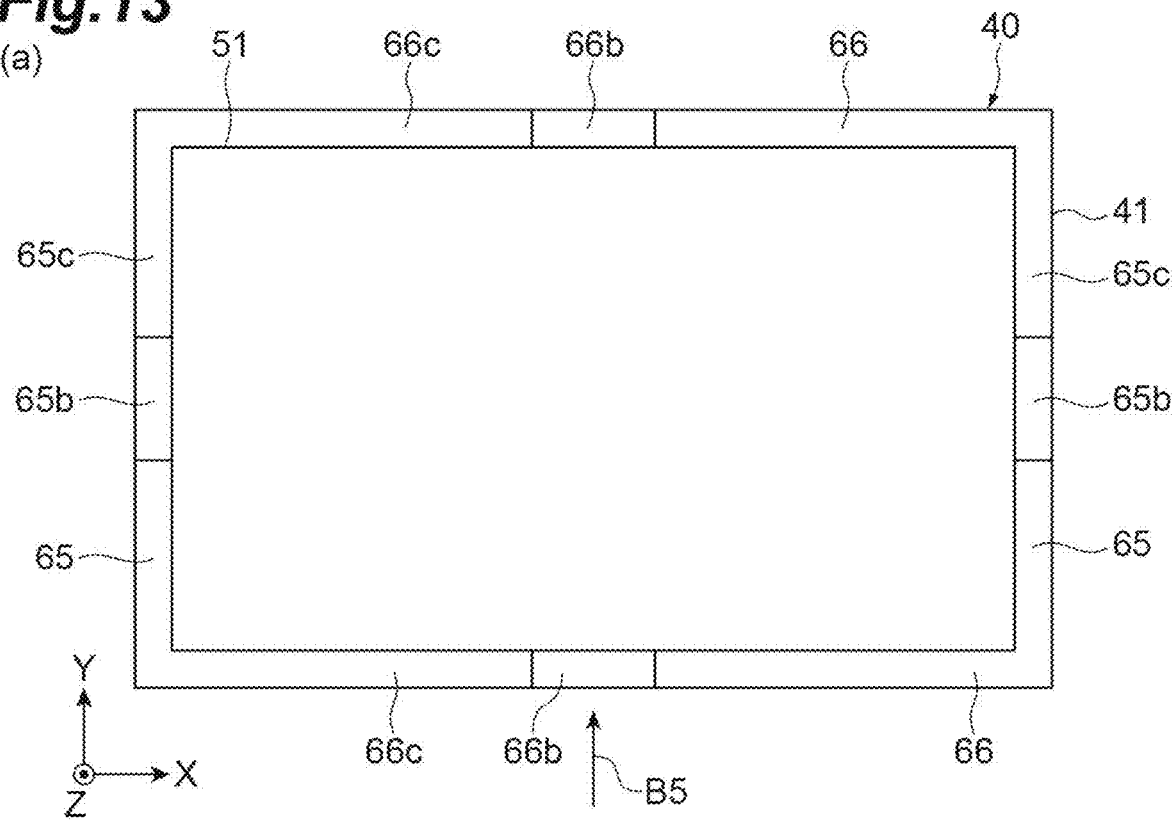
FIG. 13(a) is a plan view of the package according to a third modification example.
FIG. 13(b) is a side view of the package viewed from the arrow B5 side illustrated in FIG. 13(a).
Figure 13:
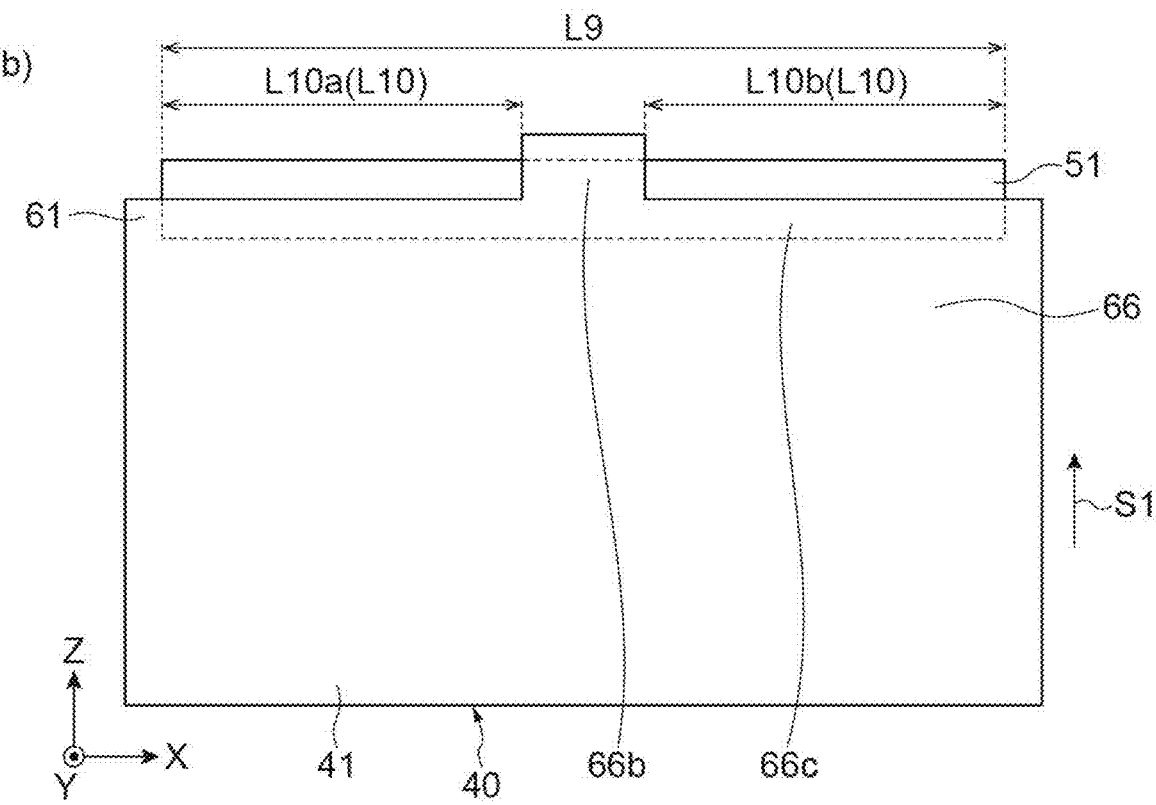

The package 40 may be configured as in a third modification example illustrated in FIGS. 13(a) and 13(b). In the third modification example, the protrusion 61 has the pair of first parts 65 extending in the Y axis direction, and the pair of second parts 66 extending in the X axis direction. Each of the first parts 65 includes a high height portion 65b provided at a middle portion, and a low height portion 65c having a lower height than the high height portion 65b. The high height portion 65b protrudes to the one side S1 from the low height portion 65c. Each of the second parts 66 includes a high height portion 66b provided at a middle portion, and a low height portion 66c having a lower height than the high height portion 66b. The high height portion 66b protrudes to the one side S1 from the low height portion 66c.

Also in the third modification example, when viewed in any direction perpendicular to the Z axis direction, the length of a part covered by the protrusion 61 in the window member 51 is longer than the length of a part exposed from the protrusion 61 in the window member 51 (a part not covered by the protrusion 61). As illustrated in FIG. 13(b), when viewed in a direction perpendicular to the Z direction, the high height portion 65b covers the entirety of the window member 51, whereas the low height portion 65c covers only a part of the window member 51 in a thickness direction. Similar to the second parts 66 as well, when viewed in a direction perpendicular to the Z direction, the high height portion 66b covers the entirety of the window member 51, whereas the low height portion 66c covers only a part of the window member 51 in the thickness direction.

As illustrated in FIG. 13(b), when viewed from the arrow B5 side, that is, when viewed in one direction perpendicular to the Z axis direction, a length L9 of a part covered by the protrusion 61 in the window member 51 is longer than a length L10 of a part exposed from the protrusion 61 in the window member 51. The length L9 is an overall length of a part covered by the protrusion 61 in the window member 51. The length L10 is an overall length of a part exposed from the protrusion 61 in the window member 51 and is the total length of lengths L10a and L10b. Similar to when viewed from the arrow B5 side, when viewed in another direction perpendicular to the Z axis direction, the length L9 of a part covered by the protrusion 61 in the window member 51 is longer than the length L10 of a part exposed from the protrusion 61 in the window member 51.

Also in the third modification example, similar to the foregoing embodiment, highly accurate light scanning can be realized while the window member 51 is reliably protected.

The present disclosure is not limited to the foregoing embodiment and modification examples. For example, a material and a shape of each of the configurations are not limited to the materials and the shapes described above, and various materials and shapes can be employed. In the foregoing embodiment, the end surface 61c of the protrusion 61 is positioned more to the one side S1 than the window member 51 throughout the whole circumference. However, at least a part of the end surface 61c need only be positioned more to the one side S1 than the window member 51.

The gaps G2 between the side surfaces 51b and 51c of the window member 51 and the inner surface 61a of the protrusion 61 may not be formed, and at least one of the side surfaces 51b and 51c of the window member 51 may be in contact with the inner surface 61a of the protrusion 61. The thickness T2 of the protrusion 61 need only be smaller than the height H of the protrusion 61 from the top surface 45a and may be larger than the thickness T1 of the window member 51. In the light scanning device 1, the minor surface 7a of the movable minor portion 10 may be held by the main body portion 41 in a state of being parallel to the main surfaces 51a of the window member 51.

The protrusion 61 may be formed separately from the main body portion 41. At least one of the main body portion 41 and the protrusion 61 may be formed of a material other than a resin. The abutment portions 63 may be omitted. The gaps G1 may not be formed between the main surfaces 51a of the window member 51 and the top surface 45a, and the window member 51 may be bonded to the main body portion 41 such that the light incident opening 41a is sealed in an airtight manner.

The main body portion 41 need only hold the light scanning device 1 such that light incident through the light incident opening 41a can be incident on the light scanning device 1 and may have any configuration. For example, a base portion for supporting the light scanning device 1 may be configured separately from the side wall 45. In the light scanning device 1 according to the embodiment, the movable minor portion 10 is driven by means of an electromagnetic force. However, the movable minor portion 10 may be driven by means of an electrostatic force or a piezoelectric element. In the foregoing embodiment, the magnetic field generation portion M is disposed inside the package 40. However, the magnetic field generation portion M may be disposed outside the package 40.

REFERENCE SIGNS LIST 100, 100A: Minor unit, 1: Light scanning device, 7a: Minor surface, 10: Movable minor portion, 40: Package, 41: Main body portion, 41a: Light incident opening, 45a: Top surface, 51: Window member, 51b, 51c: Side surface, 61: Protrusion, 61a: Inner surface, 61c: End surface, 63: Abutment portion, 63a: Abutment surface, G1, G2: Gap, S1: One side

The invention claimed is:

1. A mirror unit comprising:
a light scanning device including a movable mirror portion; and
a package accommodating the light scanning device,
wherein the package includes
a main body portion provided with a light incident opening that opens on one side in a predetermined direction and holding the light scanning device such that light incident from the light incident opening is able to be incident on the movable mirror portion,
a protrusion provided on a top surface of the main body portion so as to extend along an edge of the light incident opening, and
a flat plate-shaped window member disposed on the top surface on an inward side of the protrusion and covering the light incident opening,
wherein an end surface of the protrusion on the one side is positioned more to the one side than the window member,
wherein a thickness of the protrusion is smaller than a height of the protrusion from the top surface,
wherein when viewed in any direction perpendicular to the predetermined direction, a length of a part covered by the protrusion in the window member is longer than a length of a part exposed from the protrusion in the window member,
wherein the window member includes a portion overlapping with the top surface of the main body portion when viewed in the predetermined direction, and
wherein at least a part of a side surface of the window member faces an inner surface of the protrusion.

2. The mirror unit according to claim 1,
wherein a gap is formed between a side surface of the window member and an inner surface of the protrusion.

3. The mirror unit according to claim 1,
wherein the thickness of the protrusion is smaller than a thickness of the window member.

4. The mirror unit according to claim 1,
wherein the light scanning device is held by the main body portion in a state where a mirror surface of the movable mirror portion is inclined with respect to the window member.

5. The mirror unit according to claim 1,
wherein the protrusion is integrally formed with the main body portion.

6. The mirror unit according to claim 1,
wherein at least one of the main body portion and the protrusion is formed of a resin.

7. The mirror unit according to claim 1,
wherein an abutment portion is provided on the top surface of the main body portion so as to protrude to the one side from the top surface, the abutment portion including a flat abutment surface facing the one side, and wherein the window member is in contact with the abutment surface.

8. The mirror unit according to claim 1, wherein a gap is formed between the window member and the top surface of the main body portion.

9. The mirror unit according to claim 1, wherein the protrusion is formed in a ring shape when viewed in the predetermined direction.

* * * * *